United States Patent
Wu et al.

(10) Patent No.: US 12,376,428 B2
(45) Date of Patent: Jul. 29, 2025

(54) MICRO LIGHT-EMITTING DIODE AND MICRO LIGHT-EMITTING DEVICE WITH ROUGH SURFACE AND PROTECTION LAYER

(71) Applicant: XIAMEN SAN'AN OPTOELECTRONICS CO., LTD., Xiamen (CN)

(72) Inventors: Zheng Wu, Xiamen (CN); Chia-En Lee, Xiamen (CN); Shuo Yang, Xiamen (CN)

(73) Assignee: XIAMEN SAN'AN OPTOELECTRONICS CO., LTD., Xiamen (CN)

( * ) Notice: Subject to any disclaimer, the term of this patent is extended or adjusted under 35 U.S.C. 154(b) by 575 days.

(21) Appl. No.: 17/662,367

(22) Filed: May 6, 2022

(65) Prior Publication Data

US 2022/0359786 A1  Nov. 10, 2022

(30) Foreign Application Priority Data

May 10, 2021  (CN) .......................... 202110505600.3
May 10, 2021  (CN) .......................... 202110506934.2

(51) Int. Cl.
*H10H 20/82*   (2025.01)
*H10H 20/814*  (2025.01)

(52) U.S. Cl.
CPC .......... *H10H 20/82* (2025.01); *H10H 20/814* (2025.01)

(58) Field of Classification Search
CPC ......... H01L 33/22; H01L 33/24; H01L 33/10; H01L 33/44; H01L 33/46
See application file for complete search history.

(56) References Cited

U.S. PATENT DOCUMENTS

| | | | |
|---|---|---|---|
| 2015/0034963 A1* | 2/2015 | Kinouchi | H10H 20/841 257/76 |
| 2015/0041836 A1* | 2/2015 | Saito | H10H 20/856 257/89 |
| 2016/0072013 A1* | 3/2016 | Sugizaki | H10H 20/841 257/98 |
| 2017/0069681 A1* | 3/2017 | Lee | H10H 20/856 |
| 2018/0175261 A1* | 6/2018 | Yoo | H10H 20/82 |
| 2018/0198045 A1* | 7/2018 | Perzlmaier | H10H 20/853 |
| 2019/0181181 A1* | 6/2019 | Yeon | H01L 25/0753 |
| 2021/0074885 A1* | 3/2021 | Nakamura | G02B 5/08 |
| 2022/0344543 A1* | 10/2022 | Low | H10H 20/857 |
| 2023/0361253 A1* | 11/2023 | Qu | H10H 20/841 |

* cited by examiner

*Primary Examiner* — Chad M Dicke
*Assistant Examiner* — Jeremy Daniel Watts
(74) *Attorney, Agent, or Firm* — MUNCY, GEISSLER, OLDS & LOWE, P.C.

(57) ABSTRACT

A micro light-emitting diode includes a semiconductor stacked structure. The semiconductor stacked structure includes a first surface, a second surface opposite to the first surface, and a lateral surface connecting the first surface and the second surface. The first surface has a roughened portion, and the lateral surface is smooth. A micro light-emitting device including the micro light-emitting diode, and a display device including the micro light-emitting diode are also disclosed.

21 Claims, 12 Drawing Sheets

MICRO LIGHT-EMITTING DIODE AND MICRO LIGHT-EMITTING DEVICE WITH ROUGH SURFACE AND PROTECTION LAYER

CROSS-REFERENCE TO RELATED APPLICATION

This application claims priorities of Chinese Invention Patent Application No. 202110506934.2, filed on May 10, 2021, and Chinese Invention Patent Application No. 202110505600.3, filed on May 10, 2021.

FIELD

The disclosure relates to a micro light-emitting diode, a micro light-emitting device, and a display device.

BACKGROUND

Micro light emitting diodes (microLEDs), having advantages such as low power/energy consumption, high luminance, high resolution, high color saturation, fast response speed, and long service life, are a next generation light source for display devices and are the focus of research and development in the industry, especially for achieving higher light-extraction efficiency. Existing methods for improving the light-extraction efficiency of microLEDs include coating a side wall of the microLEDs with an insulating layer and/or roughening a light output surface of the microLEDs. However, in a process of roughening a light output surface of a microLED, a side wall of the microLED is exposed to an etching fluid and may be damaged. Especially, when a side wall of a microLED is coated with an insulating layer, the end portion of the insulating layer may be damaged due to exposure to the etching fluid. Such damage of the insulating layer causes a function failure thereof, which results in a decrease in the light-extraction efficiency of the microLED.

SUMMARY

Therefore, an object of the disclosure is to provide a micro light-emitting diode, a micro light-emitting device, and a display device which can alleviate at least one of the drawbacks of the prior art.

According to a first aspect of the disclosure, a micro light-emitting diode includes a semiconductor stacked structure. The semiconductor stacked structure includes a first surface, a second surface opposite to the first surface, and a lateral surface connecting the first surface and the second surface. The first surface has a roughened portion, and the lateral surface is smooth.

According to a second aspect of the disclosure, a micro light-emitting device includes a substrate and at least one micro light-emitting diode. The micro light-emitting diode includes a semiconductor stacked structure having a first surface, a second surface opposite to the first surface, and a lateral surface that connects the first surface and the second surface. The first surface includes a roughened portion, and the lateral surface is smooth.

According to a third aspect of the disclosure, a display device includes a substrate and at least one micro light-emitting diode. The micro light-emitting diode includes a semiconductor stacked structure having a first surface, a second surface opposite to the first surface, and a lateral surface that connects the first surface and the second surface. The first surface includes a roughened portion, and the lateral surface is smooth.

BRIEF DESCRIPTION OF THE DRAWINGS

Other features and advantages of the disclosure will become apparent in the following detailed description of the embodiment(s) with reference to the accompanying drawings, of which.

DETAILED DESCRIPTION

Figure 1:
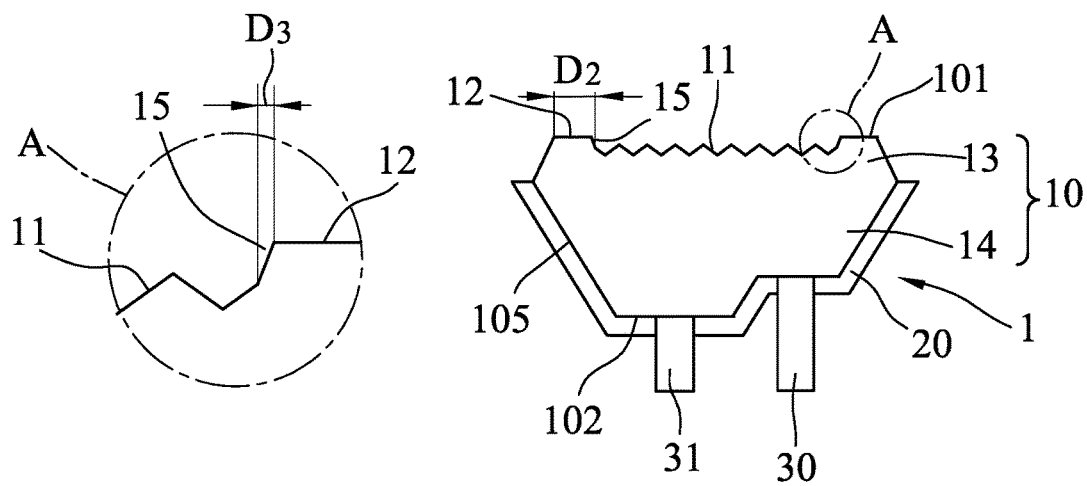
FIG. 1 is a schematic view illustrating an embodiment of a micro light-emitting diode according to the present disclosure, with showing a partially enlarged view of area A in the schematic view.

Before the disclosure is described in greater detail, it should be noted that where considered appropriate, reference numerals or terminal portions of reference numerals have been repeated among the figures to indicate corresponding or analogous elements, which may optionally have similar characteristics.

According to the present disclosure, a micro light-emitting diode is provided. The term "micro light-emitting diode" mainly refers to a micron-level light-emitting diode which has a width ranging from 2 μm to 100 μm and has a length ranging from 2 μm to 100 μm. In certain embodiment, each of the length and the width of the micro light-emitting diode ranges from 2 μm to 5 μm, from 5 μm to 10 μm, from 10 μm to 20 μm, from 20 μm to 50 μm, or from 50 μm to 100 μm.

Referring to FIG. 1, an embodiment of the micro light-emitting diode 1 according to the present disclosure includes a semiconductor stacked structure 10, an insulating layer 20, a first electrode 30 and a second electrode 31. The semiconductor stacked structure 10 has a first surface 101, a second surface 102 opposite to the first surface 101, and a lateral surface 105 connecting the first surface 101 and the second surface 102. The first surface 101 has a roughened portion 11 and a smooth portion 12 which surrounds the roughened portion 11. The roughened portion 11 may be formed to have a regular or irregular pattern, and is recessed toward the second surface 102. The lateral surface 105 is smooth.

The insulating layer 20 covers at least a portion of the second surface 102 of the semiconductor stacked structure 10. In some embodiments, the insulating layer 20 covers the second surface 102 and at least a portion of the lateral surface 105 of the semiconductor stacked structure 10. The insulating layer 20 includes at least one of titanium oxide and silicon oxide. In some embodiments, the insulating layer 20 is a distributed Bragg reflection mirror which includes titanium oxide and silicon oxide.

In a case that the insulating layer 20 includes titanium oxide, when an etching fluid, such as an alkaline solution including potassium hydroxide (KOH), is used to etch the first surface 101 to form the roughened portion 11, titanium oxide of the insulating layer 20 which is exposed to the etching fluid may be etched, so that the insulating layer 20 may lose its function. Such functional failure of the insulating layer 20 affects the light-extraction efficiency of the micro light-emitting diode.

The semiconductor stacked structure 10 includes at least a first type semiconductor layer, an active layer, and a second type semiconductor layer which are arranged on one another in such order. The first type semiconductor layer has the first surface 101, and is electrically connected to the first electrode 30. The second type semiconductor layer has the second surface 102, and is electrically connected to the second electrode 31.

In some embodiments, as shown in FIGS. 1 to 4, a distance (D2) between a periphery of the roughened portion 11 of the first surface 101 and a periphery of the first surface 101 ranges from 0.5 μm to 1 μm. As such, the first surface 101 may have relatively large light-emitting area, and the insulating layer 20 can be prevented from being exposed to the etching fluid when the first surface 101 is subjected to the etching process. In certain embodiments, the distance (D2) may be 0.5 μm, 0.8 μm, or 1 μm.

In some embodiments, the first surface 101 further has a connecting part 15 which connects the smooth portion 12 and the roughened portion 11. The connecting part 15 of the first surface 101 may be a vertical surface or an inclined surface. In addition, as shown in the partially enlarged view of the area A in FIG. 1, a horizontal distance (D3) between opposite ends of the connecting part 15 ranges from 0 μm to 0.2 μm.

Figure 2:
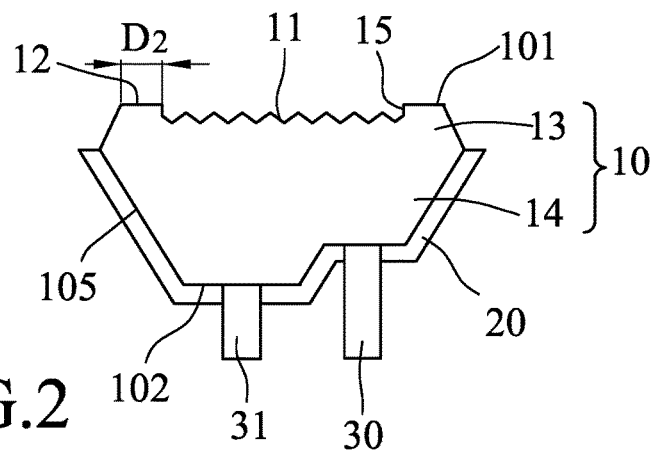
FIGS. 2 to 12 show variations of the embodiment of the micro light-emitting diode according to the present disclosure.

Referring to FIGS. 1 and 2, in some embodiments, the semiconductor stacked structure 10 further includes a first portion 13 and a second portion 14 connected to the first portion 13. The first portion 13 has the first surface 101, and the second portion 14 has the second surface 102. The first portion 13 has a maximal width that is not greater than a maximal width of the second portion 14. It should be noted that the width of the first portion 13 and the width of the second portion 14 are measured along a direction parallel to the first surface 101. The insulating layer 20 covers the second surface 102 of the semiconductor stacked structure 10 and a lateral surface of the second portion 14 of the semiconductor stacked structure 10.

Figure 3:
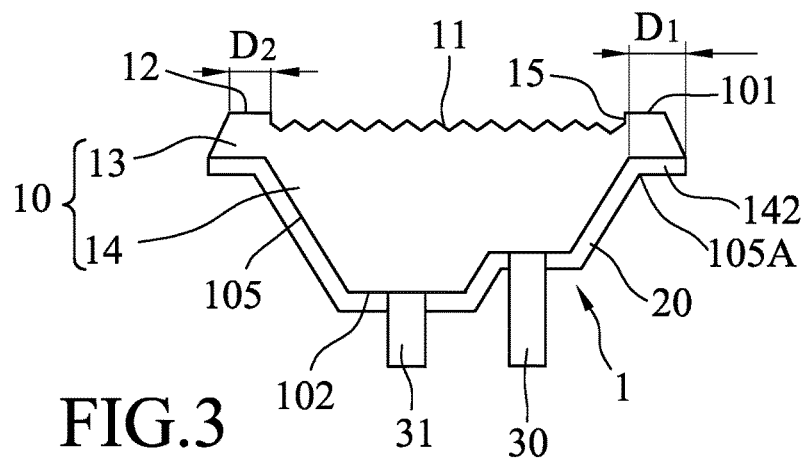

As shown in FIG. 3, the maximal width of the first portion 13 may be greater than the maximal width of the second portion 14. The insulating layer 20 may completely covers the second surface 102 of said semiconductor stacked structure 10 (except for the portion of the second surface 102 covered by the first electrode 30 and the second electrode 31) and the lateral surface of the second portion 14 of the semiconductor stacked structure 10. A portion of the insulating layer 20 that is disposed on the lateral surface of the second portion 14 of the semiconductor stacked structure 10 includes a lateral part 141 that covers the lateral surface of the second portion 14, and a horizontal part 142 which extends outwardly and laterally from an end of the lateral part 141. An intersection (a) of the lateral part 141 and the horizontal part 142 of the insulating layer 20 is located in a groove portion 105A of the lateral surface 105 of the semiconductor stacked structure 10. In other word, a projection of the intersection (a) in an imaginary horizontal plane is located within a projection of the semiconductor stacked structure 10 in the imaginary horizontal plane. Accordingly, a part of the semiconductor stacked structure 10 that protrudes outwardly from the intersection (a) can protect the insulating layer 20, such that the insulating layer 20 can be prevented from being exposed to the etching fluid which may cause a function failure of the insulating layer 20 upon etching the first surface 101, thereby improving reliability and light-extraction efficiency of the micro light-emitting diode.

Specifically, the intersection (a) is distal from the roughened portion 11 of the semiconductor stacked structure 10. A distance (D1) between the intersection (a) and an outermost peripheral edge of the semiconductor stacked structure 10 is not less than 0.5 μm. By such arrangement, the part of the semiconductor stacked structure 10 that protrudes outwardly from the intersection (a) can surely protect the insulating layer 20.

In certain embodiments, the first portion 13 of the semiconductor stacked structure 10 has a thickness not less than 0.5 μm. If the thickness of the first portion 13 is less than 0.5 μm, in the etching process of the first surface 101, the etching fluid may penetrate through the part of the semiconductor stacked structure 10 outside of the intersection (a) to the insulating layer 20, and thus the part of the semiconductor stacked structure 10 outside of the intersection (a) cannot protect the insulating layer 20.

Figure 4:
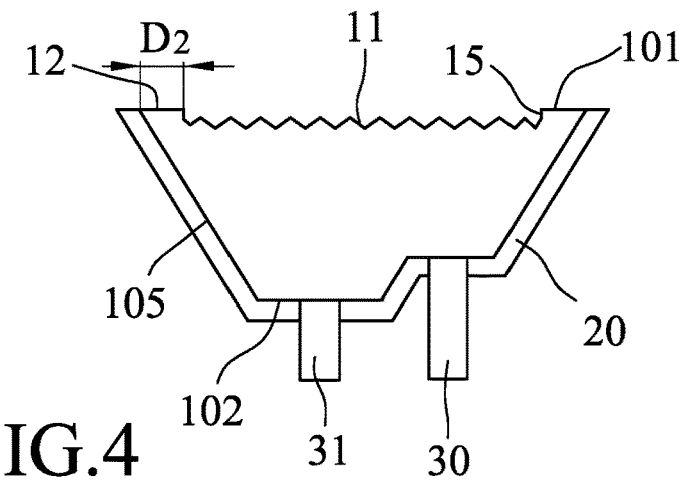
Figure 5:
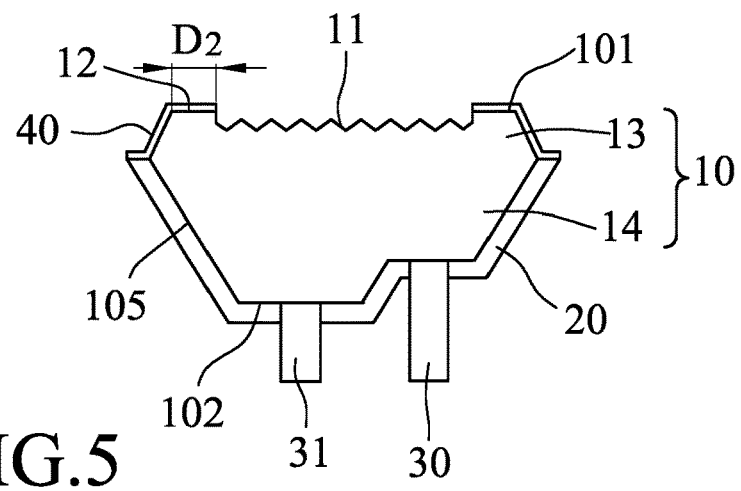
Figure 6:
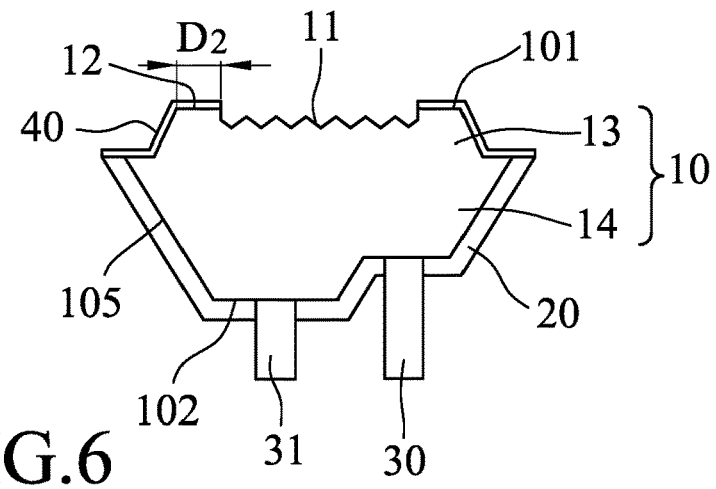

Referring to FIG. 4, the insulating layer 20 may be configured to cover the second surface 102 of the semiconductor stacked structure 10 and to completely cover the lateral surface 105 of the semiconductor stacked structure 10.

Referring to FIGS. 5 to 8, in some embodiments, the micro light-emitting diode further includes a protection layer 40. The protection layer 40 covers at least a part of the smooth portion 12 and a portion of the lateral surface 105 that is not covered by the insulating layer 20. An end of the protection layer 40 in proximity of the roughened portion 11 is flushed with an end of the smooth portion 12 in proximity of the roughened portion 11. An end of the protection layer 40 distal from the roughened portion 11 is flushed with an outer edge of the insulating layer 20. Alternatively, the end of the protection layer 40 distal from the roughened portion 11 may projects from the outer edge of the insulating layer 20. The protection layer 40 may be formed by plasma chemical vapor deposition or atomic layer deposition, may be made of at least one of silicon oxide, silicon nitride, and aluminum oxide, and may have a thickness ranging from 100 Å to 20000 Å.

Before forming the smooth portion 12 and the roughened portion 11 of the semiconductor stacked structure 10, the protection layer 40 is formed to cover a portion of the first surface 101 and a portion of the lateral surface 105 of the semiconductor stacked structure 10 that is not covered by the insulating layer 20. Thus, after the first surface 101 is exposed to the etching fluid in the etching process, the semiconductor stacked structure 10 that is covered by the protection layer 40 becomes the smooth portion 12, while the semiconductor stacked structure 10 that is not covered by the protection layer 40 becomes the roughened portion 11. In the formation of the roughened portion 11, the insulating layer 20, covering the lateral surface 105 of the semiconductor stacked structure 10, is not exposed to the etching fluid. Thus, the insulating layer 20 can be prevented from being damaged by the etching fluid, so as to avoid the function failure of the insulating layer 20, and thus the reliability and the light-extraction efficiency of the micro light-emitting diode can be improved. The etching fluid may be an etching liquid or an etching gas. In this embodiment, the etching fluid is an alkaline solution such as, but not limited to, a potassium hydroxide (KOH) solution.

Figure 9:
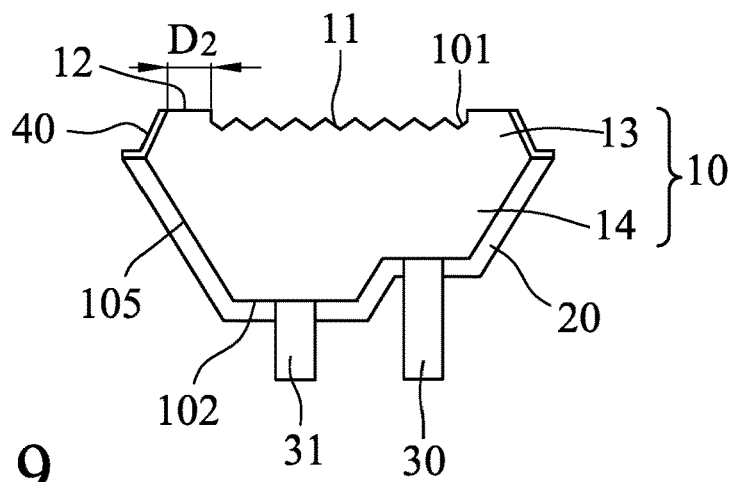

Referring to FIG. 9, alternatively, the protection layer 40 may only cover a top side of the insulating layer 20 and a portion of the lateral surface 15 of the semiconductor stacked structure 10 that is not covered by the insulating layer 20.

Figure 10:
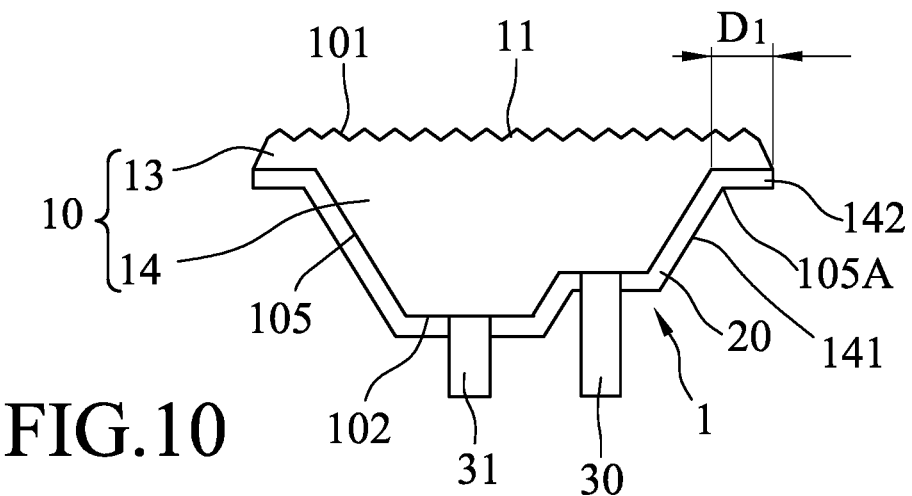

Referring to FIG. 10, in some embodiments, the micro light-emitting diode includes the semiconductor stacked structure 10 and the insulating layer 20. The first surface 101 of the semiconductor stacked structure 10 is configured to have the roughened portion 11 that is formed on the entire area or a part of area of the first surface 101, and that is formed to have a regular or irregular shape. The insulating layer 20 covers at least a portion of the second surface 102 and a portion of the lateral surface 105 of the semiconductor stacked structure 10. Similar to FIG. 3, a portion of the insulating layer 20 that is disposed on the lateral surface 105 of the semiconductor stacked structure 10 includes a lateral part 141 and a horizontal part 142. An intersection (a) of the lateral part 141 and the horizontal part 142 of the insulating layer 20 is located in a groove portion 105A of the lateral surface 105 of the semiconductor stacked structure 10. In other word, a projection of the intersection (a) in an imaginary horizontal plane is located within a projection of the semiconductor stacked structure 10 in the imaginary horizontal plane.

Since the semiconductor stacked structure 10 is configured to have the horizontal part 142 that extends outwardly from an end of the lateral part 141, a part of the semiconductor stacked structure 10 that protrudes outwardly from the intersection (a) can protect the insulating layer 20, such that the insulating layer 20 can be prevented from being exposed to the etching fluid which may causes a function failure of the insulating layer 20 upon etching the first surface 101, thereby improving reliability and light-extraction efficiency of the micro light-emitting diode.

In some embodiments, the distance (D1) between the intersection (a) and an outermost peripheral edge of the semiconductor stacked structure 10 is not less than 0.5 μm. That is, the part of the semiconductor stacked structure 10 that protrudes outwardly from the intersection (a) has a length measured from the intersection (a) being not less than 0.5 μm. By such arrangement, the part of the semiconductor stacked structure 10 that protrudes outwardly from the intersection (a) can protect the insulating layer 20.

Specifically, as shown in FIG. 10, the roughened portion 11 is formed on the entire area of the first surface 101, and the smooth portion 12 is omitted in this embodiment. Similarly, the semiconductor stacked structure 10 also includes the first portion 13 and the second portion 14 connected to the first portion 13. The first portion 13 has the first surface 101, and the second portion 14 has the second surface 102. The first portion 13 has a maximal width that is greater than a maximal width of the second portion 14. It should be noted that the width of the first portion 13 and the width of the second portion are measured along a direction parallel to the first surface 101. The insulating layer 20 covers the second surface 102 of the semiconductor stacked structure 10 and the lateral surface of the second portion 14 of the semiconductor stacked structure 10. The lateral part 141 of the insulating layer 20 is a part that covers the lateral surface of the second portion 14, and the horizontal part 142 of the insulating layer 20 is a part that extends outwardly and horizontally from a top end of the lateral surface of the second portion 14.

The first portion 13 of the semiconductor stacked structure 10 has a thickness not less than 0.5 μm. If the thickness of the first portion 13 is less than 0.5 μm, in the etching process of the first surface 101, the etching fluid may penetrate through the part of the semiconductor stacked structure 10 outside of the intersection (a) to the insulating layer 20, and thus the part of the semiconductor stacked structure outside of the intersection (a) cannot protect the insulating layer 20.

Figure 11:
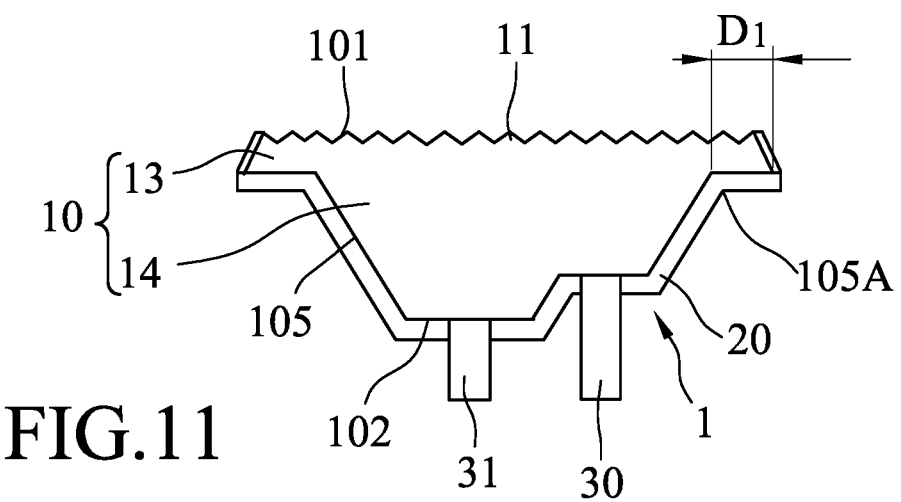

In some embodiments, as shown in FIG. 11, the lateral surface of the first portion 13 is covered by the protection layer 40.

Figure 7:
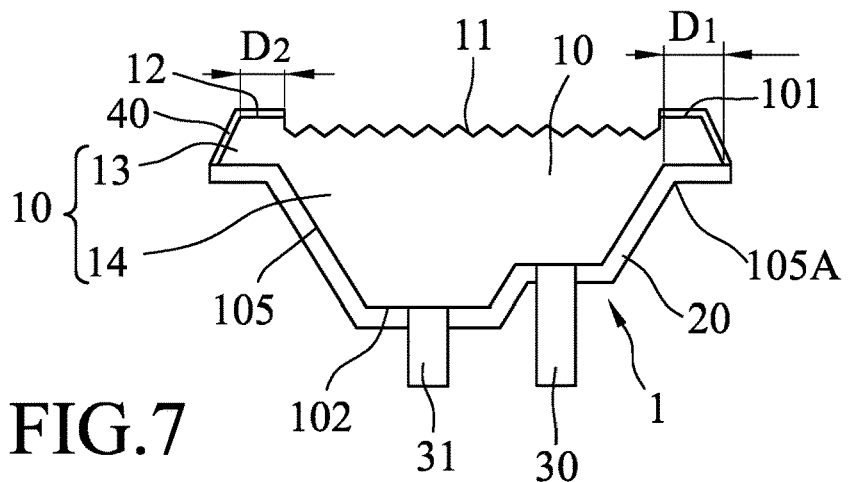
Figure 8:
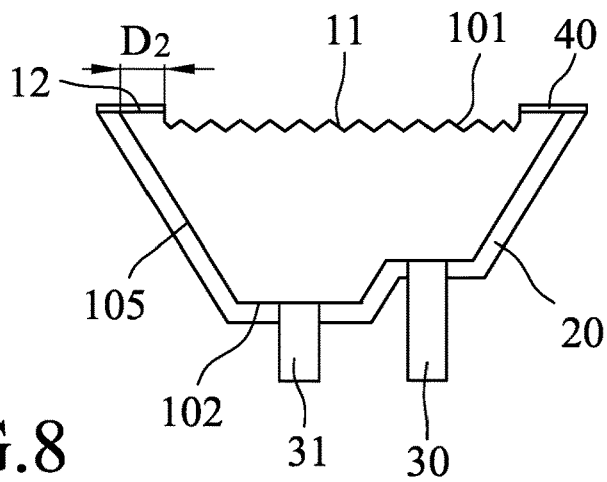
Figure 12:
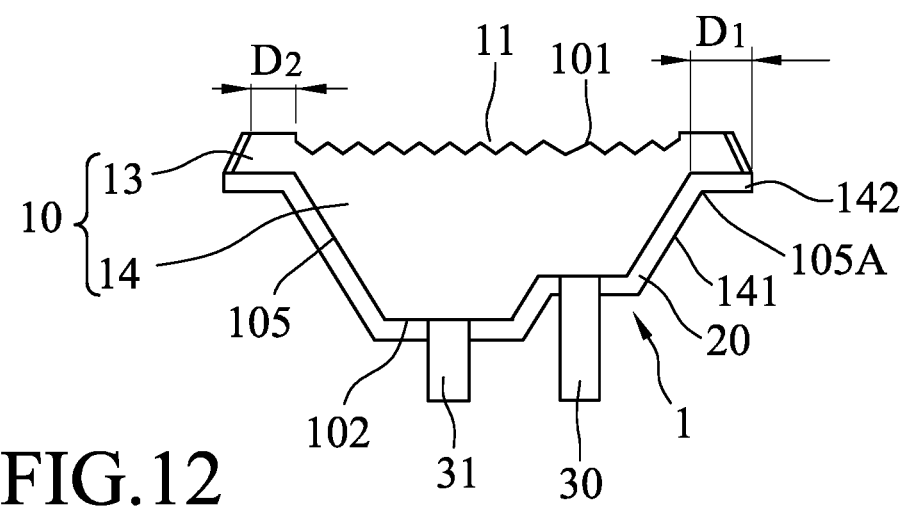

In some embodiments, as shown in FIG. 12, unlike the embodiment shown in FIG. 7, the protection layer 40 is configured to not cover the smooth portion 12 but only covers a portion of the lateral surface 105 of the semiconductor stacked structure 10 that is not covered by the insulating layer 20. In such embodiments, the smooth portion 12 may be formed by covering an area of the first surface 101 with the protection layer 40 such that the covered area of the first surface 101 can be prevented from being etched away in the etching process of the first surface 101. Accordingly, the insulating layer 20 can be prevented from being exposed to the etching fluid which may causes a function failure of the insulating layer 20 in the etching process of the first surface 101, thereby improving reliability and light-extraction efficiency of the micro light-emitting diode.

In some embodiments, the protection layer 40 covers a portion of the first surface 101, and a portion of the lateral surface 105 of the semiconductor stacked structure 10 that is not covered by the insulating layer 20. The protection layer 40 that covers the first surface 101 has a width ranging from 0.5 μm to 1 μm.

Referring to FIGS. 13 to 19, an embodiment of a method for manufacturing the micro light-emitting diode 1 shown in FIG. 1 is provided.

Figure 13:
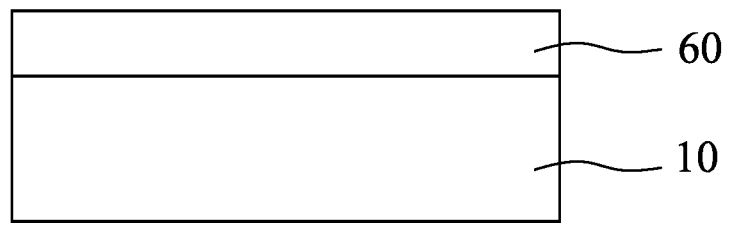
FIGS. 13 to 19 show steps in a process of manufacturing the micro light emitting diode shown in FIG. 1 according to the present disclosure.

As shown in FIG. 13, a growth substrate 60 is provided. The growth substrate 60 may be a sapphire substrate having a flat surface, or a sapphire substrate having a patterned surface. A semiconductor unit 10' is formed on the growth substrate 60 by chemical vapor deposition. The semiconductor unit 10' includes a first type semiconductor film, an active film, and a second type semiconductor film which are arranged on one another in such order. The first type semiconductor film is located proximate to the growth substrate 60, and the second type semiconductor film is located distal from the growth substrate 60.

Figure 14:
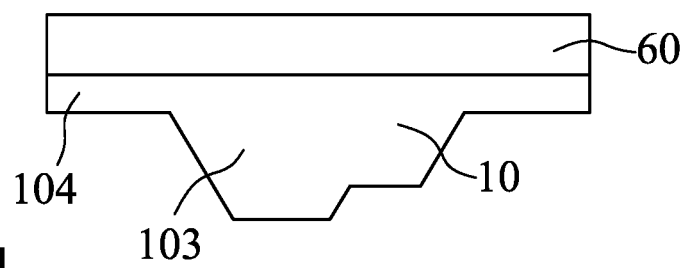

As shown in FIG. 14, the semiconductor unit 10' is subjected to an etching process such that the semiconductor unit 10' is formed into the semiconductor stacked structure 10 and a dicing portion 104 surrounding the semiconductor stacked structure 10. The semiconductor stacked structure 10 is in a stage structure 103

Figure 15:
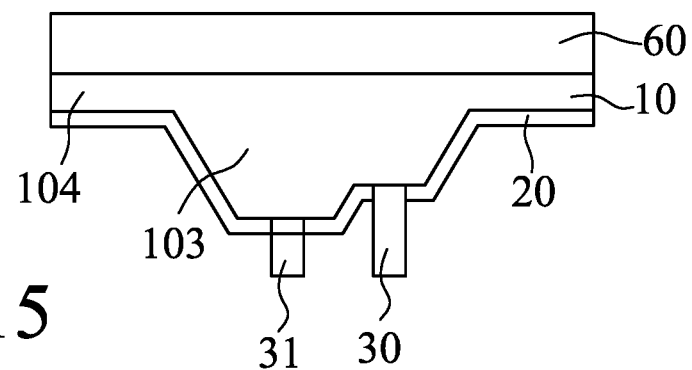

As shown in FIG. 15, the insulating layer 20 is formed to cover the stage structure 103 and the dicing portion 104. Then, the first electrode 30 and the second electrode 31 that are respectively and electrically connected to the first and second type semiconductor layers are formed. In this embodiment, as shown in FIG. 16, the insulating layer 20 has a first opening 201 that allows the first electrode 30 to extend therethrough to be electrically connected to the first type semiconductor layer, and a second opening 202 that allows the second electrode 31 to extend therethrough to be electrically connected to the second type semiconductor layer.

Figure 16:
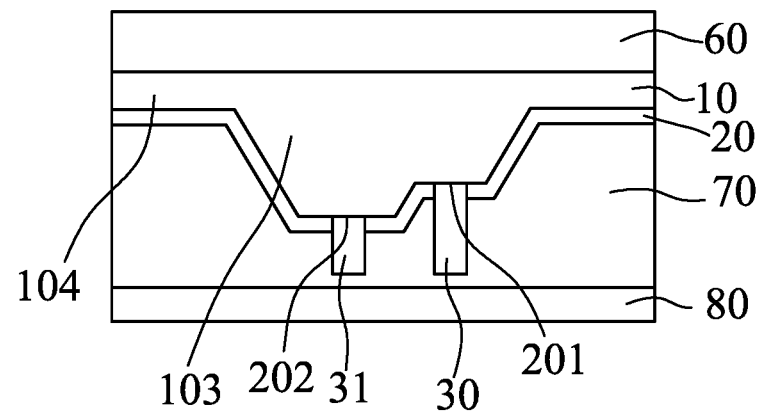

As shown in FIG. 16, a sacrificial layer 70 is formed to cover the insulating layer 20, and a transfer substrate 80 is formed on the sacrificial layer 70 so that the semiconductor stacked structure 10 is securely mounted on the transfer substrate 80 via the sacrificial layer 70.

Figure 17:
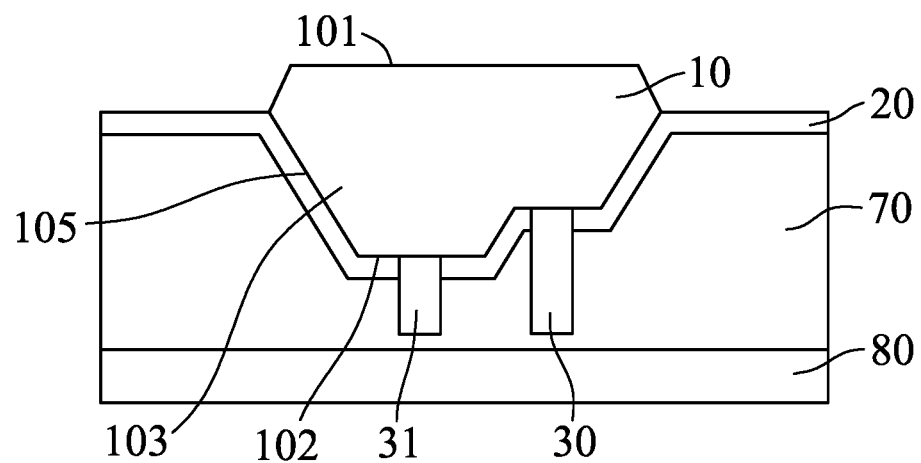

As shown in FIG. 17, the growth substrate 60 and the semiconductor material located at the dicing portion 104 are removed. The degree of removing the semiconductor material at the dicing portion 104 is controllable. After this step, the stage structure 103 has the first surface 101, the second surface 102 opposite to the first surface 101, and the lateral surface 105 connecting the first surface 101 and the second surface 102. The second surface 102 is located proximate to the transfer substrate 80, and the first surface 101 is located distal from the transfer substrate 80.

Figure 18:
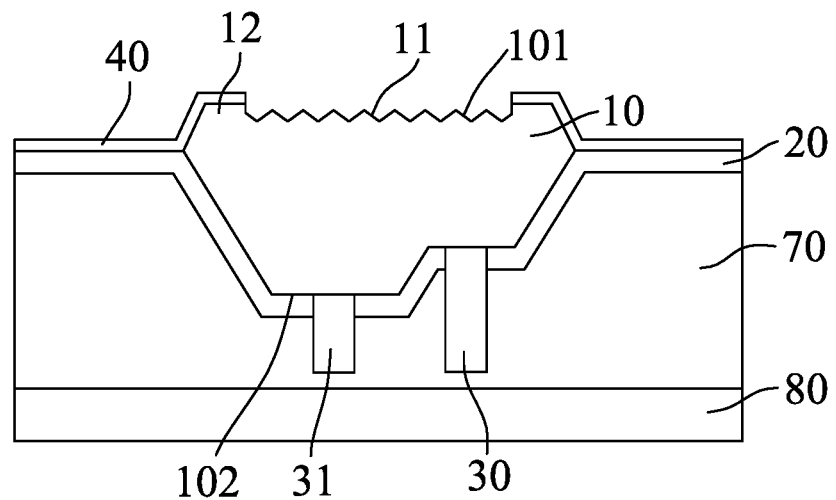

As shown in FIG. 18, the protection layer 40 is formed to cover a part of the insulating layer 20 that corresponds in position to the dicing portion 104 (shown in FIG. 16) and a part of the first surface 101. Then, the first surface 101, that is exposed, is subjected to an etching process such as a wet etching process or a dry etching process so as to become roughened. Preferably, the etching process of the first surface 101 is a wet etching process. The protection layer 40 is made from at least one of silicon oxide, silicon nitride, and aluminum oxide. The protection layer 40 is formed by plasma chemical vapor deposition or atomic layer deposition, and has a thickness ranging from 100 Å to 20000 Å.

By virtue of the protection layer 40, the part of the insulating layer 20 and the part of the first surface 101 that are covered by the protection layer 40 can be protected so as not to be exposed to the etching fluid in the etching process of the first surface 101, thereby avoiding the function failure of the insulating layer 20. The first surface 101 that is etched in the etching process becomes the roughened portion 11 that is surrounded by the smooth portion 12.

Figure 19:
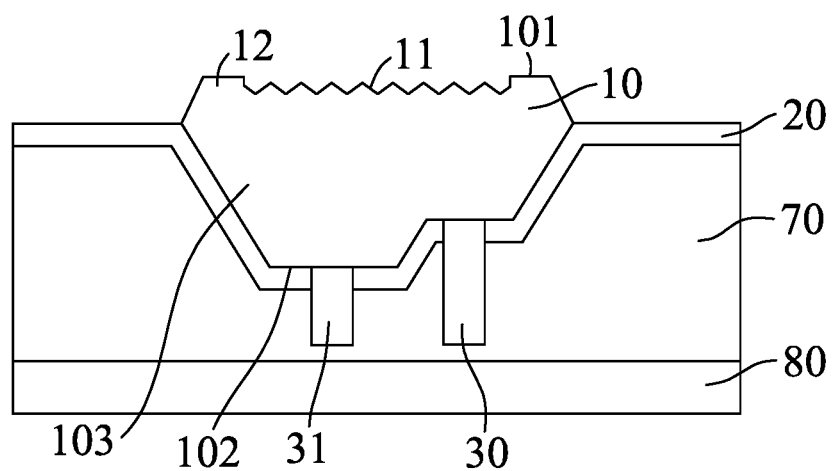

As shown in FIG. 19, the protection layer 40 is entirely removed by an etching process, and the sacrificial layer 70 and the transfer substrate 80 are removed, and the residual semiconductor material at the dicing portion 104 is entirely removed. Thus, the micro light-emitting diode shown in FIG. 1 is obtained.

Alternatively, after removing the protection layer 40, the stage structure 103 may be further transferred to a next transfer substrate (not shown), and the sacrificial layer 70 and the transfer substrate 80 on the second surface 102 are removed, and then the next transfer substrate on the first surface 101 is removed. Thus, the micro light-emitting diode 1 shown in FIG. 1 is obtained.

It should be noted that, for manufacturing the micro light-emitting diode shown in FIG. 2 or 3, it is only necessary to control the degree of removing the semiconductor material at the dicing portion 104 (shown in FIG. 16).

It should be also noted that, for manufacturing the micro light-emitting diode shown in FIG. 4, it is only necessary to entirely remove the semiconductor material at the dicing portion 104 (see FIG. 16).

It should be further noted that, for manufacturing the micro light-emitting diode shown in any one of FIGS. 5 to 9, it is only necessary to not remove the protection layer 40 or to remove only a part of the protection layer 40.

Referring to FIGS. 20 to 26, an embodiment of a method for manufacturing the micro light-emitting diode shown 1 in FIG. 3 is provided. The method of this embodiment is similar to the method for manufacturing the micro light-emitting diode 1 shown in FIG. 1.

Figure 20:
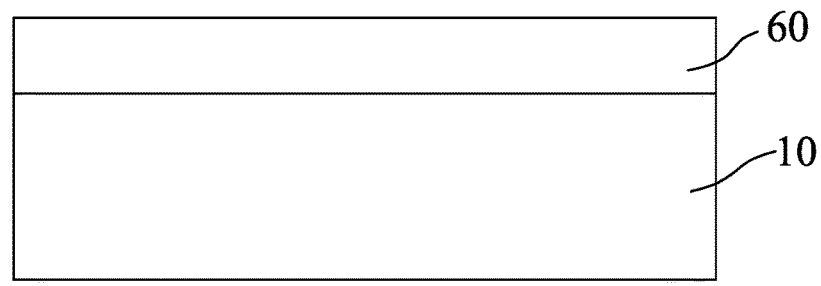
FIGS. 20 to 26 show steps in a process of manufacturing the micro light emitting diode shown in FIG. 3 according to the present disclosure.

As shown in FIG. 20, the growth substrate 60 is provided.

Figure 21:
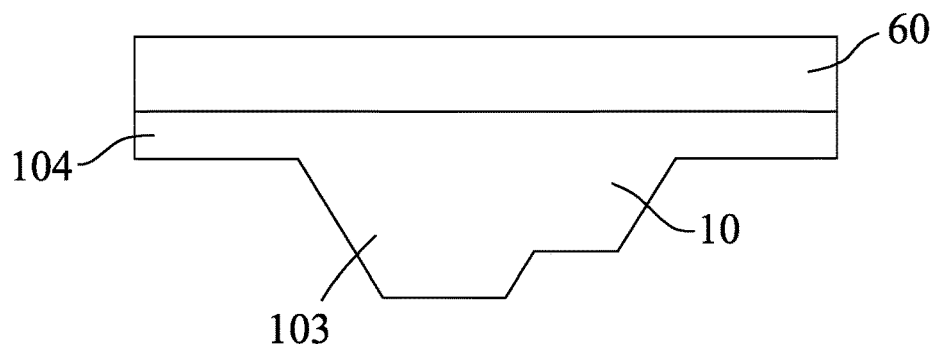

As shown in FIG. 21, the semiconductor unit 10' is subjected to an etching process such that the semiconductor unit 10' is formed into the semiconductor stacked structure 10 (having the stage structure 103) and the dicing portion 104 surrounding the stage structure 103.

Figure 22:
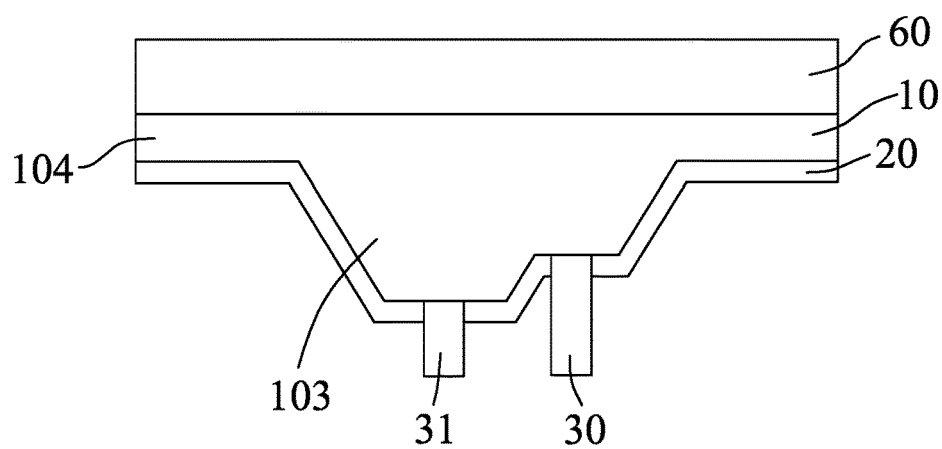

As shown in FIG. 22, the insulating layer 20 is formed to cover the stage structure 103 and the dicing portion 104, and the first electrode 30 and the second electrode 31 that are respectively and electrically connected to the first and second type semiconductor layers are formed.

Figure 23:
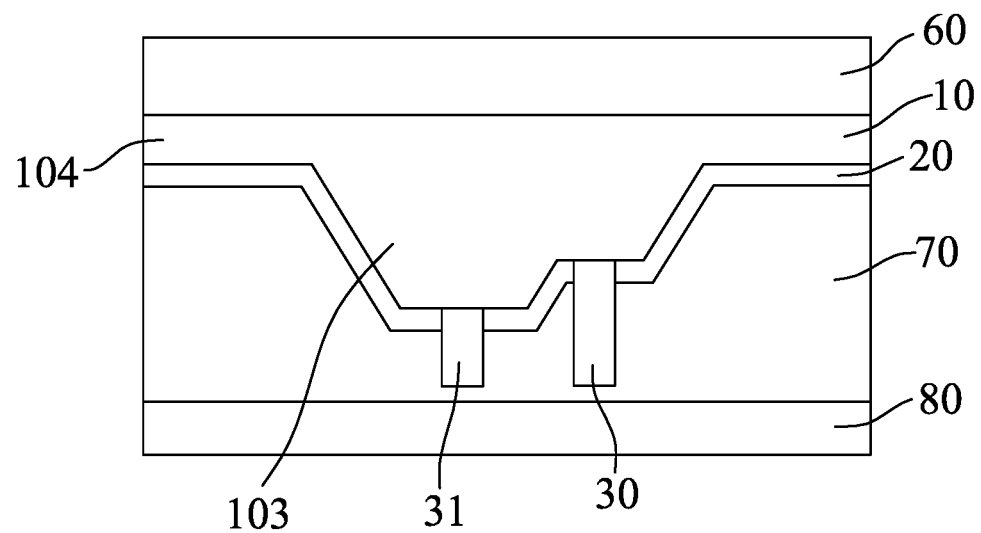

As shown in FIG. 23, the sacrificial layer 70 is formed to cover the insulating layer 20, and the transfer substrate 80 is formed on the sacrificial layer 70 so that the semiconductor stacked structure 10 is securely mounted on the transfer substrate 80 via the sacrificial layer 70.

Figure 24:
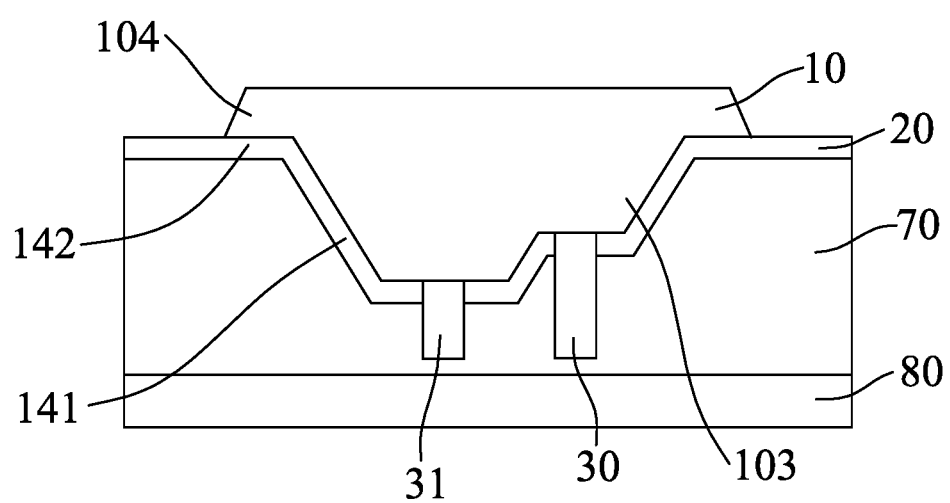

As shown in FIG. 24, the growth substrate 60 and a part of a residual semiconductor material at the dicing portion 104 are removed. In this embodiment, by controlling the degree of removing the semiconductor material located at the dicing portion 104, the intersection (a) of the lateral part 141 and the horizontal part 142 of the insulating layer 20 is located within the outermost peripheral edge of the semiconductor stacked structure 10. After this step, the stage structure 103 has the first surface 101, the second surface 102 opposite to the first surface 101, and the lateral surface 105 connecting the first surface 101 and the second surface 102 (shown in FIG. 25). The second surface 102 is located proximate to the transfer substrate 80, and the first surface 101 is located distal from the transfer substrate 80.

Figure 25:
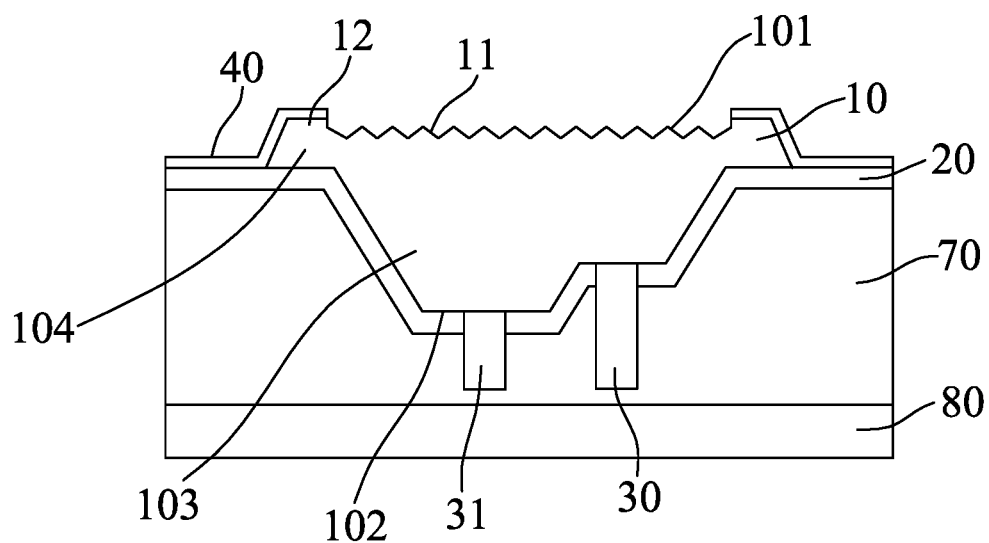

As shown in FIG. 25, the protection layer 40 is formed to cover a portion of the first surface 101 and a part of the insulating layer 20 that corresponds in position to the dicing portion 104. Then, the first surface 101, that is exposed, is subjected to an etching process such as a wet etching process or a dry etching process so as to become roughened. Preferably, the etching process of the first surface 101 is a wet etching process. The protection layer 40 is formed by plasma chemical vapor deposition or atomic layer deposition, and has a thickness ranging from 100 Å to 20000 Å.

By virtue of the protection layer 40, the portion of the insulating layer 20 and the portion of the first surface 101 that are covered by the protection layer 40 can be protected so as not to be exposed to the etching fluid in the etching process of the first surface 101, thereby avoiding the function failure of the insulating layer 20. The first surface 101 that is etched in the etching process becomes the roughened portion 11 that is surrounded by the smooth portion 12.

Figure 26:
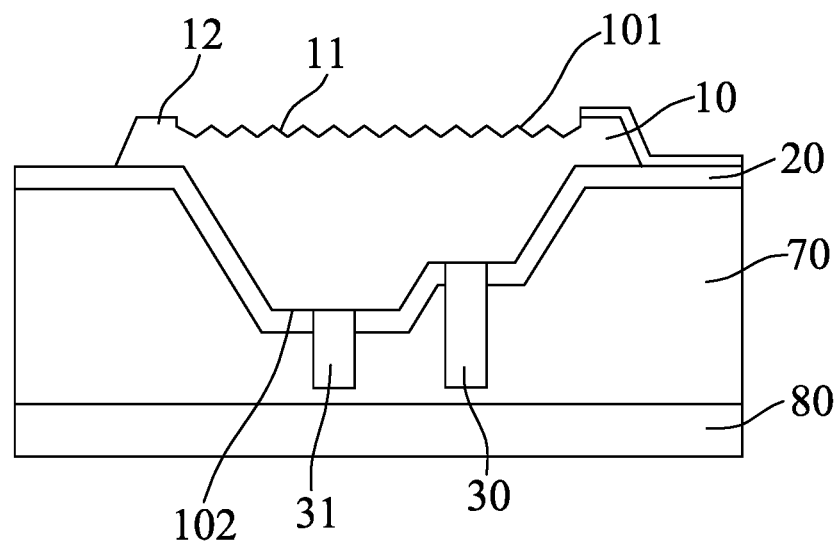

As shown in FIG. 26 and FIG. 3, the protection layer 40 is entirely removed, and the sacrificial layer 70 and the transfer substrate 80 are removed, and a part of the insulating layer 20 that corresponds in position to the dicing portion 104 is cut way. Thus, the micro light-emitting diode 1 shown in FIG. 3 is obtained.

It should be noted that, for manufacturing the micro light-emitting diode shown in FIG. 10, it is not necessary to form the protection layer 40 on the first surface 101 and on the insulating layer 20 that covers the dicing portion 104, and the first surface 101 may be directly subjected to the etching process.

It should be also noted that, for manufacturing the micro light-emitting diode shown in FIG. 11, it is only necessary to form the protection layer 40 on a portion of the lateral surface 105 of the semiconductor stacked structure 10 and the insulating layer 20 that covers the dicing portion 104, before subjecting the first surface 101 to the etching process.

It should be further noted that, for manufacturing the micro light-emitting diode shown in FIG. 7 or 12, the protection layer 40 may not be removed or may only be partially removed.

According to the disclosure, a micro light-emitting device is provided.

Figure 27:
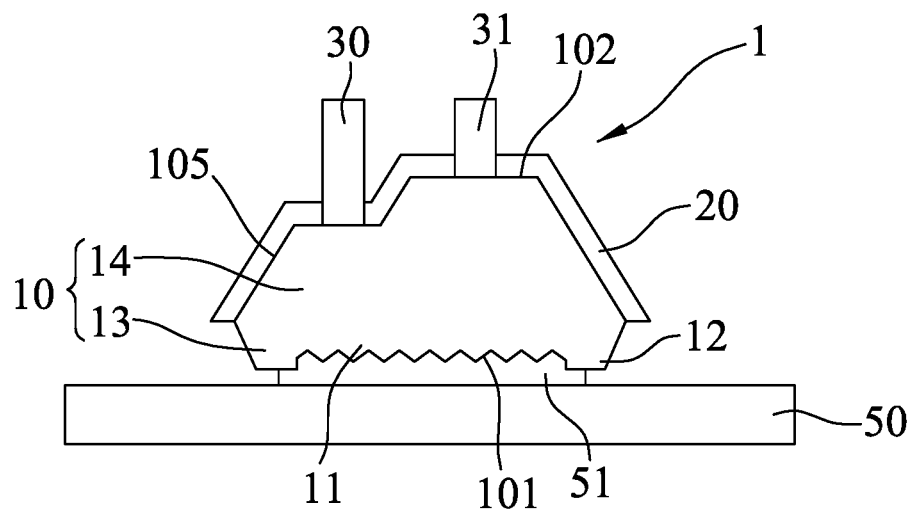
FIG. 27 is a schematic view illustrating an embodiment of a micro light-emitting device according to the present disclosure.
Figure 28:
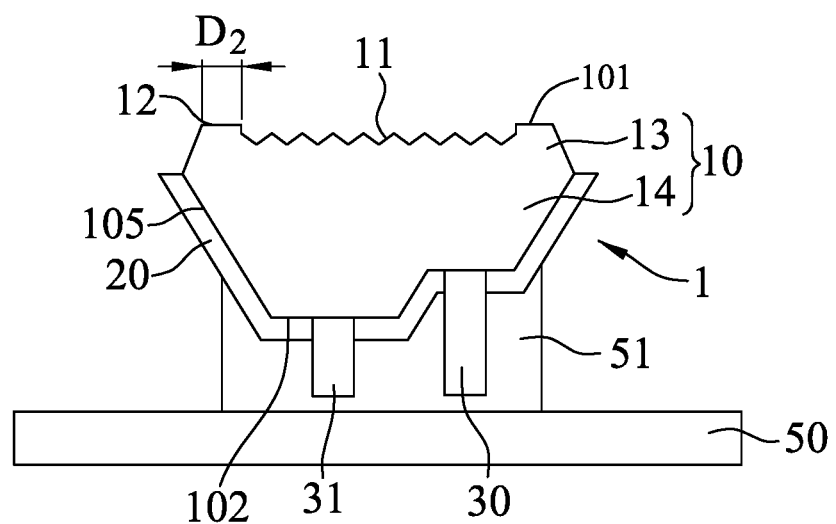
FIG. 28 shows a variation of the embodiment of the micro light-emitting device according to the present disclosure.

Referring to FIGS. 27 and 28, an embodiment of a micro light-emitting device according to the present disclosure is illustrated. In this embodiment, the micro light-emitting device includes a supporting substrate 50 and at least one aforesaid micro light-emitting diode 1. The first surface 101 of the semiconductor stacked structure 10 may face to the supporting substrate 50 (see FIG. 27), or may face away from the supporting substrate 50 (see FIG. 28). It should be noted that FIGS. 27 and 28 merely show examples of the micro light-emitting device that include the micro light-emitting diode 1 shown in FIG. 1, and the micro light-emitting diode included in those examples of the micro light-emitting device may be altered to the micro light-emitting diode shown in any one of FIGS. 2 to 9.

Referred to FIGS. 27 and 28, each micro light-emitting diode 1 includes the semiconductor stacked structure 10 having the first surface 101, the second surface 102 opposite to the first surface 101, and the lateral surface 105 connecting the first surface 101 and the second surface 102. The first surface 101 has the roughened portion 11 and the smooth portion 12 which surrounds the roughened portion 11. The roughened portion 11 may be formed to have a regular or irregular pattern, and is recessed toward the second surface 102. The lateral surface 105 is smooth. The first surface 101 faces the substrate 50. Alternatively, the first surface 101 may be opposite to the substrate 50.

The insulating layer 20 covers at least a portion of the second surface 102 of the semiconductor stacked structure 10. In some embodiments, the insulating layer 20 covers the second surface 102 and at least a portion of the lateral surface 105 of the semiconductor stacked structure 10. The insulating layer 20 includes at least one of titanium oxide and silicon oxide. In some embodiments, the insulating layer 20 is a distributed Bragg reflection mirror which includes titanium oxide and silicon oxide.

The semiconductor stacked structure 10 includes at least the first type semiconductor layer, the active layer, and the second type semiconductor layer which are arranged on one another in such order. The first type semiconductor layer has the first surface 101, and is electrically connected to the first electrode 30. The second type semiconductor layer has the second surface 102, and is connected to the second electrode 31.

In some embodiments, the supporting substrate 50 is one of a metal substrate, a sapphire substrate, a glass substrate, a silicon substrate, a silicon carbide substrate, and a supporting film. When the substrate 50 is one of a metal substrate, a sapphire substrate, a glass substrate, a silicon substrate, and a silicon carbide substrate, the micro light-emitting device further includes an adhesive film 51 disposed between the supporting substrate 50 and the at least one micro light-emitting diode 1 for mounting the at least one micro light-emitting diode 1 on the supporting substrate 50. The adhesive film facilitates transfer of the at least one micro light-emitting diode 1 onto the supporting substrate 50. The adhesive film 51 may include polyamide resin or acrylic resin. The Polyimide resin and acrylic resin may partially absorb the laser light having ultraviolet wavelength, and are capable of being decomposed by the laser light having ultraviolet wavelength. Therefore, if the adhesive film 51 includes polyamide resin or acrylic resin, the micro light-emitting diode can be prevented from being damaged by the laser light. Preferably, the adhesive film 51 is adapted to absorb at least a part of a laser light having a wavelength not greater than 360 nm, and is adapted to have a transmittance not less than 90% for the laser light having a wavelength not greater than 360 nm.

The adhesive film 51 has a width not smaller than a maximal width of the semiconductor stacked structure 10. It should be noted that the width of the adhesive film 51 and the width of the semiconductor stacked structure 10 are measured along a direction parallel to the first surface 101. The adhesive film 51 has a thickness ranging from 0.1 μm to 2 μm. Preferably, the thickness of the adhesive film 51 is not greater than 0.5 μm. Alternatively, the thickness of the adhesive film 51 may be less than 0.1 μm to alleviate light absorption by the adhesive film 51.

Alternatively, the width of the adhesive film 51 may be smaller than the maximal width of the semiconductor stacked structure 10. In this embodiment, the area of the adhesive film 51 is 80% to 90% of the area of the semiconductor stacked structure 10. That is, a projection of the adhesive film 51 in an imaginary horizontal plane is 80% to 90% of a projection of the semiconductor stacking layer structure 10 in the imaginary horizontal plane.

In some embodiments, referring to FIGS. 27 and 28, a distance (D2) between the roughened portion 11 of the first surface 101 and a periphery of the first surface 101 ranges from 0.5 μm to 1 μm. As such, the first surface 101 may have relatively large light-emitting area, and the insulating layer 20 can be prevented from being exposed to the etching fluid when the first surface 101 is subjected to the etching process. In certain embodiments, the distance (D2) may be 0.5 μm, 0.8 μm, or 1 μm.

The connecting part 15 that connects the smooth portion 12 and the roughened portion 11 may be a vertical surface or an inclined surface. In addition, a horizontal distance (D3, see FIG. 1) between opposite ends of the connecting part 15 ranges from 0 μm to 0.2 μm.

In some embodiments, referring to FIGS. 27 and 28, the semiconductor stacked structure 10 includes the first portion 13, and the second portion 14 connected to the first portion 13. The first portion 13 is located proximate to the first surface 101 of the semiconductor stacked structure 10, and the second portion 14 is located distal from the first surface 101 of the semiconductor stacked structure 10. The first portion 13 has a maximal width that is not greater than a maximal width of the second portion 14. It should be noted that the width of the first portion 13 and the width of the second portion 14 are measured along a direction parallel to the first surface 101. The insulating layer 20 covers the second surface 102 of the semiconductor stacked structure 10 and a lateral surface of the second portion 14 of the semiconductor stacked structure 10.

Figure 29:
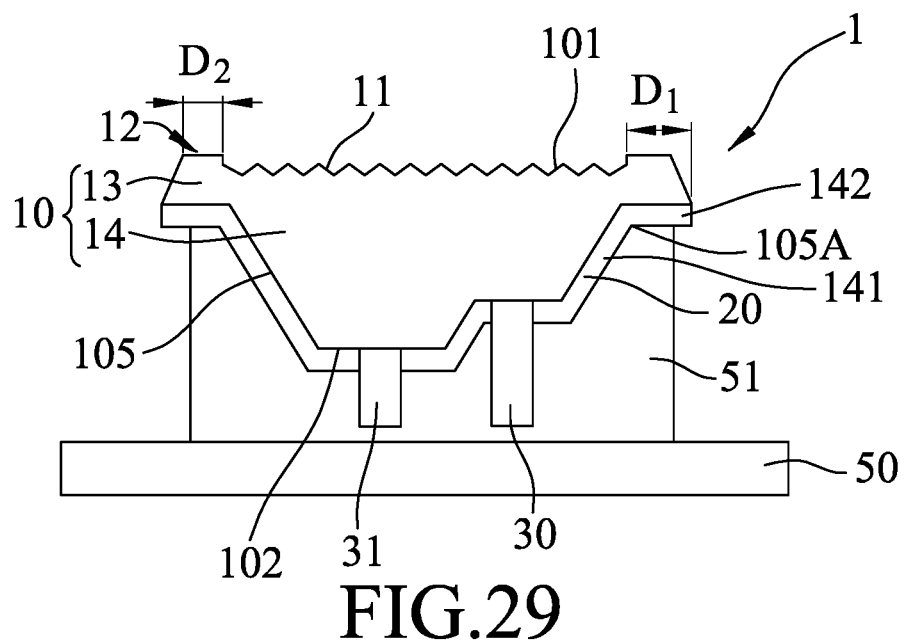
FIG. 29 is a schematic view illustrating another embodiment of a micro light-emitting device according to the present disclosure.
Figure 30:
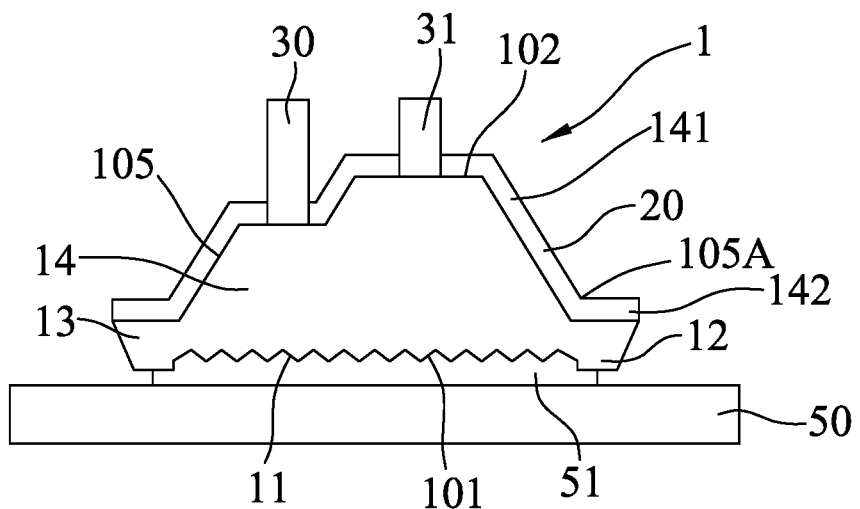
FIG. 30 show a variation of the embodiment of the micro light-emitting device according to the present disclosure.

Referring to FIGS. 29 and 30, another embodiment of a micro light-emitting device according to the present disclosure is generally similar to the micro light-emitting device of the previous embodiment, except for the following differences. The micro light-emitting device shown in FIG. 29 or 30 includes the micro light-emitting diode 1 shown in FIG. 3, and it may be altered to the micro light-emitting diode shown in any one of FIGS. 7, 10, 11, 12. That is, in this embodiment, the maximal width of the first portion 13 is greater than the maximal width of the second portion 14. The insulating layer 20 covers the second surface 102 of the semiconductor stacked structure 10 and the lateral surface of the second portion 14 of the semiconductor stacked structure 10. A portion of the insulating layer 20 that is disposed on the lateral surface of the second portion 14 of the semiconductor stacked structure 10 includes the lateral part 141 that covers the lateral surface of the second portion 14, and the horizontal part 142 which extends outwardly and laterally from an end of the lateral part 141. The intersection (a) of the lateral part 141 and the horizontal part 142 of the insulating layer 20 is located in the groove portion 105A of the lateral surface 105 of the semiconductor stacked structure 10. In other word, a projection of the intersection (a) in an imaginary horizontal plane is located within a projection of the semiconductor stacked structure 10 in the imaginary horizontal plane. Accordingly, a part of the semiconductor stacked structure 10 that protrudes outwardly from the intersection (a) can protect the insulating layer 20, such that the insulating layer 20 can be prevented from being exposed to the etching fluid which may cause a function failure of the insulating layer 20 upon etching the first surface 101, thereby improving reliability and light-extraction efficiency of the micro light-emitting diode.

The intersection (a) is distal from the roughened portion 11 of the semiconductor stacked structure 10. A distance (D1) between the intersection (a) and an outermost peripheral edge of the semiconductor stacked structure 10 is not less than 0.5 μm. By such arrangement, the part of the semiconductor stacked structure 10 that protrudes outwardly from the intersection (a) can surely protect the insulating layer 20.

The first portion 13 of the semiconductor stacked structure 10 has a thickness not less than 0.5 μm. If the thickness of the first portion 13 is less than 0.5 μm, in the etching process of the first surface 101, the etching fluid may penetrate through the part of the semiconductor stacked structure 10 outside of the intersection (a) to the insulating layer 20, and thus the part of the semiconductor stacked structure outside of the intersection (a) cannot protect the insulating layer 20.

Alternatively, the insulating layer 20 may cover the second surface 102 and may fully cover the lateral surface 105 of the semiconductor stacked structure 10.

In some embodiments, the micro light-emitting diode further includes the protection layer 40. In a case that the insulating layer 20 includes titanium oxide, when the first surface 101 is subjected to the etching process, if the insulating layer 20 is exposed to the etching fluid, titanium oxide in the insulating layer 20 may be etched, so that the insulating layer 20 may lose its function. Such functional failure of the insulating layer 20 affects the light-extraction efficiency of the micro light-emitting diode. Therefore, before the etching process, the protection layer 40 may be formed to cover a portion of the first surface 101 and a portion of the lateral surface 105 of the semiconductor stacked structure 10 that is not covered by the insulating layer 20. Thus, after the first surface 101 is exposed to the etching fluid in the etching process, the semiconductor stacked structure 10 that is covered by the protection layer becomes the smooth portion 12, while the semiconductor stacked structure 10 that is not covered by the protection layer 40 becomes the roughened portion 11. In the formation of the roughened portion 11, the insulating layer 20, covering the lateral surface 105 of the semiconductor stacked structure 10, is not exposed to the etching fluid. Thus, the insulating layer 20 can be prevented from being damaged by the etching fluid, so as to avoid the function failure of the insulating layer 20, and thus the reliability and the light-extraction efficiency of the micro light-emitting diode can be improved.

The protection layer 40 covers at least a portion of the second surface 102 and a portion of the lateral surface 105 that is not covered by the insulating layer 20. An end of the protection layer in proximity of the roughened portion 11 is flushed with an end of the smooth portion 12 in proximity of the roughened portion 11. An end of the protection layer 40 distal from the roughened portion 11 is flushed with an outer edge of the insulating layer 20. Alternatively, the end of the protection layer 40 distal from the roughened portion 11 may projects from the outer edge of the insulating layer 20.

The protection layer 40 may be formed by plasma chemical vapor deposition or atomic layer deposition, may be made of at least one of silicon oxide, silicon nitride, and aluminum oxide, and may have a thickness ranging from 100 Å to 20000 Å.

Alternatively, the protection layer 40 may covers a portion of the lateral surface 105 that is not covered by the insulating layer 20.

According to the present disclosure, a display device is also provided. An embodiment of the display device according to the present disclosure is similar to the aforesaid micro-light emitting device, and includes the supporting substrate and at least one aforesaid light-emitting diode.

In sum, according to the embodiments of the present disclosure, the first surface 101 of the semiconductor stacked structure 10 includes the roughened portion 11 and the smooth portion 12 that surrounds the roughened portion 11. The smooth portion 12 may be formed by covering an area of the first surface 101 with the protection layer 40 such that the covered area of the first surface 101 can be prevented from being etched or being thinned in the etching process of the first surface 101. In this process, if the insulating layer 20 is disposed on the lateral surface of the semiconductor stacked structure 10, the insulating layer 20 can be prevented from being exposed to the etching fluid. As such, the insulating layer 20 can be prevented from being damaged by the etching fluid, so as to avoid the function failure of the insulating layer 20, and thus the reliability and the light-extraction efficiency of the micro light-emitting diode can be improved.

Furthermore, the protection layer 40 may be formed to cover a portion of the first surface 101 that becomes the smooth portion 12 after the etching process, and a portion of the lateral surface 105 of the semiconductor stacked structure 10 that is not covered by the insulating layer 20. Therefore, the insulating layer 20 that is disposed on the lateral surface 105 of the semiconductor stacked structure 10 can be protected by the protection layer 40, such that the insulating layer 20 that is disposed on the lateral surface 105 of the semiconductor stacked structure 10 can be prevented from being exposed to the etching fluid which may cause a function failure of the insulating layer 20 in the etching process of the first surface 101, and thereby improving reliability and light-extraction efficiency of the micro light-emitting diode. The protection layer 40 may be removed or retained after the etching process of the first surface 101.

Besides, a part of the insulating layer 20 that is disposed on the lateral surface 105 of the semiconductor stacked structure 10 may include the lateral part 141 and the horizontal part 142. In such arrangement, by ensuring that the intersection (a) of the lateral part 141 and the horizontal part 142 of the insulating layer 20 is located within the outermost peripheral edge of the semiconductor stacked structure 10, the insulating layer 20 that is disposed on the lateral surface 105 of the semiconductor stacked structure 10 can be protected by the semiconductor stacked structure 10. Thus, the intersection (a) of the lateral part 141 and the horizontal part 142 of the insulating layer 20 can be prevented from being exposed to the etching fluid in the etching process of the first surface 101, and thereby preventing the insulating layer 20 that is disposed on the lateral surface 105 of the semiconductor stacked structure 10 from being damaged by the etching fluid, so as to avoid the function failure of the insulating layer 20, and thus the reliability and the light-extraction efficiency of the micro light-emitting diode can be improved.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A micro light-emitting diode, comprising:
    a semiconductor stacked structure which includes
        a first surface,
        a second surface opposite to said first surface, and
        a lateral surface connecting said first surface and said second surface,
    wherein:
    said first surface has a roughened portion, and said lateral surface is smooth;
    said micro light-emitting diode further includes an insulating layer covering at least a portion of said second surface and at least a portion of said lateral surface of said semiconductor stacked structure;
    a portion of said insulating layer that covers said lateral surface of said semiconductor stacked structure includes a lateral part and a horizontal part;
    an intersection of said lateral part and said horizontal part is located in a groove portion of said lateral surface of said semiconductor stacked structure;
    said intersection is distal from said roughened portion of said semiconductor stacked structure; and
    a distance between said intersection and an outermost peripheral edge of said semiconductor stacked structure is not less than 0.5 μm.

2. The micro light-emitting diode of claim 1, wherein said first surface further includes a smooth portion which surrounds said roughened portion, and said roughened portion of said first surface is recessed toward said second surface.

3. The micro light-emitting diode of claim 1, wherein said micro light-emitting diode has a width ranging from 2 μm to 100 μm and has a length ranging from 2 μm to 100 μm.

4. The micro light-emitting diode of claim 1, wherein a distance between a periphery of said roughened portion of said first surface and a periphery of said first surface ranges from 0.5 μm to 1 μm.

5. The micro light-emitting diode of claim 1, wherein:
    said semiconductor stacked structure has a first portion and a second portion connected to said first portion;
    said first portion has said first surface of said semiconductor stacked structure, and said second portion has said second surface of said semiconductor stacked structure; and
    said first portion has a maximal width that is greater than a maximal width of said second portion.

6. The micro light-emitting diode of claim 5, wherein said first portion has a thickness not less than 0.5 μm.

7. The micro light-emitting diode of claim 1, wherein said insulating layer is a distributed Bragg reflection mirror, said distributed Bragg reflection mirror including titanium oxide.

8. The micro light-emitting diode of claim 1, further comprising a protection layer covering at least a part of said smooth portion, said protection layer being made of one of silicon oxide, silicon nitride, aluminum oxide, and combinations thereof.

9. The micro light-emitting diode of claim 8, wherein said protection layer has a thickness ranging from 100 Å to 20000 Å.

10. The micro light-emitting diode of claim 1, wherein said insulating layer includes titanium oxide.

11. The micro light-emitting diode of claim 1, wherein said insulating layer completely covers said second surface of said semiconductor stacked structure and a lateral surface of said second portion of said semiconductor stacked structure.

12. The micro light-emitting diode of claim 1, further comprising a protection layer that covers a lateral surface of said first portion of said semiconductor stacked structure.

13. The micro light-emitting diode of claim 1, further comprising a protection layer, said protection layer covering a portion of said first surface outside of said roughened portion, wherein said protection layer that covers said first surface has a width ranging from 0.5 μm to 1 μm.

14. The micro light-emitting diode of claim 12, wherein said protection layer is made from one of silicon oxide, silicon nitride, aluminum oxide, and combinations thereof.

15. The micro light-emitting diode of claim 12, wherein said protection layer has a width ranging from 100 Å to 20000 Å.

16. A micro light-emitting device, comprising:
    a substrate; and
    at least one micro light-emitting diode which includes a semiconductor stacked structure having a first surface, a second surface opposite to said first surface, and a lateral surface that connects said first surface and said second surface,
    wherein:
    said first surface includes a roughened portion, and said lateral surface is smooth; and
    a distance between said roughened portion of said first surface and a periphery of said first surface ranges from 0.5 μm to 1 μm.

17. The micro light-emitting device of claim 16, wherein said first surface further includes a smooth portion which surrounds said roughened portion, and said roughened portion is recessed toward said second surface.

18. The micro light-emitting device of claim 16, wherein said substrate includes one of a metal substrate, a sapphire substrate, a glass substrate, a silicon substrate, a silicon carbide substrate, a supporting film, and combinations thereof.

19. The micro light-emitting device of claim 16, wherein:
said substrate has a supporting surface for supporting said at least one micro light-emitting diode;
said micro light-emitting device further includes an adhesive film disposed between said supporting surface and said at least one micro light-emitting diode; and
said adhesive film has a width smaller than a maximal width of said semiconductor stacked structure.

20. The micro light-emitting device of claim 16, wherein:
said semiconductor stacked structure further includes a first portion, and a second portion connected to said first portion;
said first portion is located proximate to said first surface of said semiconductor stacked structure, and said second portion is located distal from said first surface of said semiconductor stacked structure; and
said first portion has a maximal width that is greater than a maximal width of said second portion.

21. A display device, comprising:
a substrate; and
at least one micro light-emitting diode which includes a semiconductor stacked structure having a first surface, a second surface opposite to said first surface, and a lateral surface that connects said first surface and said second surface,
wherein:
said first surface includes a roughened portion, and said lateral surface is smooth; and
a distance between said roughened portion of said first surface and a periphery of said first surface ranges from 0.5 μm to 1 μm.

* * * * *